United States Patent
Choukalos et al.

(10) Patent No.: US 6,425,109 B1
(45) Date of Patent: Jul. 23, 2002

(54) HIGH LEVEL AUTOMATIC CORE CONFIGURATION

(75) Inventors: Charles N. Choukalos, Burlington; Alvar Antonio Dean, Essex Junction; Scott Alan Tetreault, Georgia; Sebastian Theodore Ventrone, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/360,384

(22) Filed: Jul. 23, 1999

(51) Int. Cl.[7] .............................................. G06F 17/50
(52) U.S. Cl. ........................................................ 716/1
(58) Field of Search ............................ 715/1, 8, 11, 18; 713/1

(56) References Cited

U.S. PATENT DOCUMENTS

| | | |
|---|---|---|
| 5,313,615 A | 5/1994 | Newman et al. |
| 5,384,710 A | 1/1995 | Lam et al. |
| 5,424,589 A | 6/1995 | Dobbelaere et al. |
| 5,452,227 A | 9/1995 | Kelsey et al. |
| 5,487,018 A | 1/1996 | Loos et al. |
| 5,526,277 A | 6/1996 | Dangelo et al. |
| 5,550,839 A | 8/1996 | Buch et al. |
| 5,617,431 A | 4/1997 | Tupuri et al. |
| 5,638,380 A | 6/1997 | De |
| 5,644,498 A | 7/1997 | Joly et al. |
| 5,661,662 A | 8/1997 | Butts et al. |
| 5,666,289 A | 9/1997 | Watkins |
| 5,774,380 A | 6/1998 | Pickup et al. |
| 5,812,416 A | 9/1998 | Gupte et al. |

FOREIGN PATENT DOCUMENTS

JP 9232436 9/1997

*Primary Examiner*—Thomas M. Heckler
(74) *Attorney, Agent, or Firm*—Schmeiser, Olsen & Watts; Richard M. Kotulak

(57) ABSTRACT

A system and method for interconnecting a plurality of cores into a single functional core. The method involves creating for each core a pin configuration structure based on a set of configuration rules. When the cores to be interconnected are selected, the pin configuration structure is accessed by the configurator program tool of the present invention. The configurator program tool then connects the cores together using the pin configuration structure and configuration rules for the selected cores. The configurator program tool generates an error-free high level model of the interconnected cores. The configurator program tool allows configuration flexibility and is general enough to handle most configuration scenarios. The tool is also easy to code, extensible, and can be applied to existing core designs with no modification of the cores themselves.

17 Claims, 6 Drawing Sheets

HIGH LEVEL AUTOMATIC CORE CONFIGURATION

FIELD OF THE INVENTION

The present invention relates generally to methods and systems for integrating a plurality of interacting cores into a single functional core assembly. More specifically, the present invention relates to a method and system for interconnecting chiplet-based cores or multiple cores into a single functional core.

BACKGROUND OF THE INVENTION

The integration levels possible with today's high density semiconductor processes have totally changed the model for intellectual property (IP) development and usage in the electronics industry. The ability to integrate millions of gates on an application specific integrated circuit (ASIC) has given rise to the System-On-Chip (SOC), or System-Level-Integration ASIC models where system houses cannot afford the development time and expense of developing their own IP for complex ASICs, and must, therefore, rely on integrating high-level functional cores together from the ASIC provider.

The task of integrating many large cores into a single SOC design involves many challenges for both the system house and the core provider from the interconnection of the cores to the functional verification and testing. Often, especially for complex cores, the core provider cannot create a single core to satisfy the requirements of all the users in all market segments. This forces the core provider to either generate and support many variations of the core, or modularize complex cores into many smaller pieces, commonly referred to as chiplets, which are then put together in various configurations to create specific variations of the core.

While the chiplet approach simplifies the core supplier maintenance task, it further complicates the core user's (the system house's) job, as they now have to manage more pieces and get involved with the core at a lower level than intended. The task of connecting the chiplets together into a core has been done by interconnecting all chiplet I/Os manually or with a schematic capture tool. Since there may be thousands of internal connections between chiplets inside a core, connecting the chiplets together manually or with a schematic capture tool can be an error prone process. If chiplets are interconnected manually, many errors can be introduced into the final product, such as misconnected pins and improper configurations which may violate an electrical or testing requirement. Since the high level HDL (e.g., VERILOG or VHDL) for the chiplets does not contain information about physical or interconnection requirements, it is impossible to automatically check the interconnections of the chiplets, and errors may not be discovered or corrected until the ASIC build step, losing critical design time and time to market.

The chiplets can also be interconnected by a custom configuration program created by the core provider that is specific to the chiplets. However, the flexibility in customer configuration is limited by the custom program's algorithms. Furthermore, whenever a chiplet interface change occurs, the custom program must change accordingly.

SUMMARY OF THE INVENTION

It is an advantage of the present invention to provide an alternate approach to the prior art described above that simplifies the core user's task of interconnecting chiplet-based cores, or multiple-cores, and automatically generates an error free high level model of the core.

It is a further advantage of the present invention to provide a configurator program tool that configures chiplet-based cores, or multiple-cores, automatically into a single functional core to meet customer specific needs and can be used on any core.

According to a broad aspect of the present invention, a method of creating a system of interconnected cores is provided, comprising the steps of: creating for each core a pin configuration structure based on a set of pin configuration rules; selecting a plurality of cores to be interconnected; accessing the pin configuration structure for the cores selected; and connecting the cores using a connectivity program based on the pin configuration structure and configuration rules for the selected cores.

The method further comprises the steps of: determining a fanout limit for each pin of the cores; and connecting the cores in a multiple fanout configuration using the connectivity program to ensure that an acceptable number of fanout connections is not exceeded. The method also comprises the steps of: determining for each pin of the cores whether the pin is part of a group of related pins; and using the connectivity program to match each group of related pins together when connecting the cores. The connectivity program is initialized by choosing a set of cores to be connected together, flagging external pins on the cores, and loading descriptive files containing the pin configuration structure and configuration rules. Upon executing the connectivity program, a high level source is generated that contains information about the system of interconnected cores created. A logical verification is then made based on the source.

According to another broad aspect of the present invention, a computer system is provided that has a central processing unit; a bus; a computer system memory; and a configurator tool stored in the computer system memory. The computer system memory is connected to the central processing unit via the bus. The configurator tool is executable on the central processing unit and is operable to create a system of interconnected cores based on a pin configuration structure and a set of configuration rules for the cores. The configurator tool is also operable to perform the other steps of the method described above.

According to still another aspect of the present invention, a computer-readable medium is provided that has computer-executable instructions for creating a system of interconnected cores. The instructions on the computer-readable medium are executable to perform the steps of: accessing a pin configuration structure and a set of configuration rules for the cores; and connecting the cores together based on the pin configuration structure and the configuration rules. The instructions on the computer-readable medium are further executable to perform the other steps of the method described above.

Numerous other advantages of the present invention will be apparent to those skilled in this art from the following description wherein there is shown and described a preferred embodiment of the present invention, simply by way of illustration of one of the modes best suited to carry out the invention. As will be realized, the invention is capable of other different embodiments, and its several details are capable of modification in various obvious aspects without departing from the invention. Accordingly, the drawings and description should be regarded as illustrative in nature and not restrictive.

BRIEF DESCRIPTION OF THE DRAWINGS

The present invention will become more clearly appreciated as the disclosure of the invention is made with reference to the accompanying drawings. In the drawings.

DETAILED DESCRIPTION OF THE PREFERRED EMBODIMENT

A preferred embodiment of the present invention will now be described with reference to FIGS. 1 to 6 of the accompanying drawings.

The present invention provides a program tool for interconnecting a plurality of cores into a single functional core. As used in this application, the term 'core' refers to each of the various functional blocks that make up an ASIC. Such functional blocks are referred to in this application as both 'cores' and 'chiplets,' with the understanding that a chiplet is merely a core of relatively low complexity. Cores can range in size and complexity from a simple RAM memory core to a much more complex embedded processor core.

Figure 1:
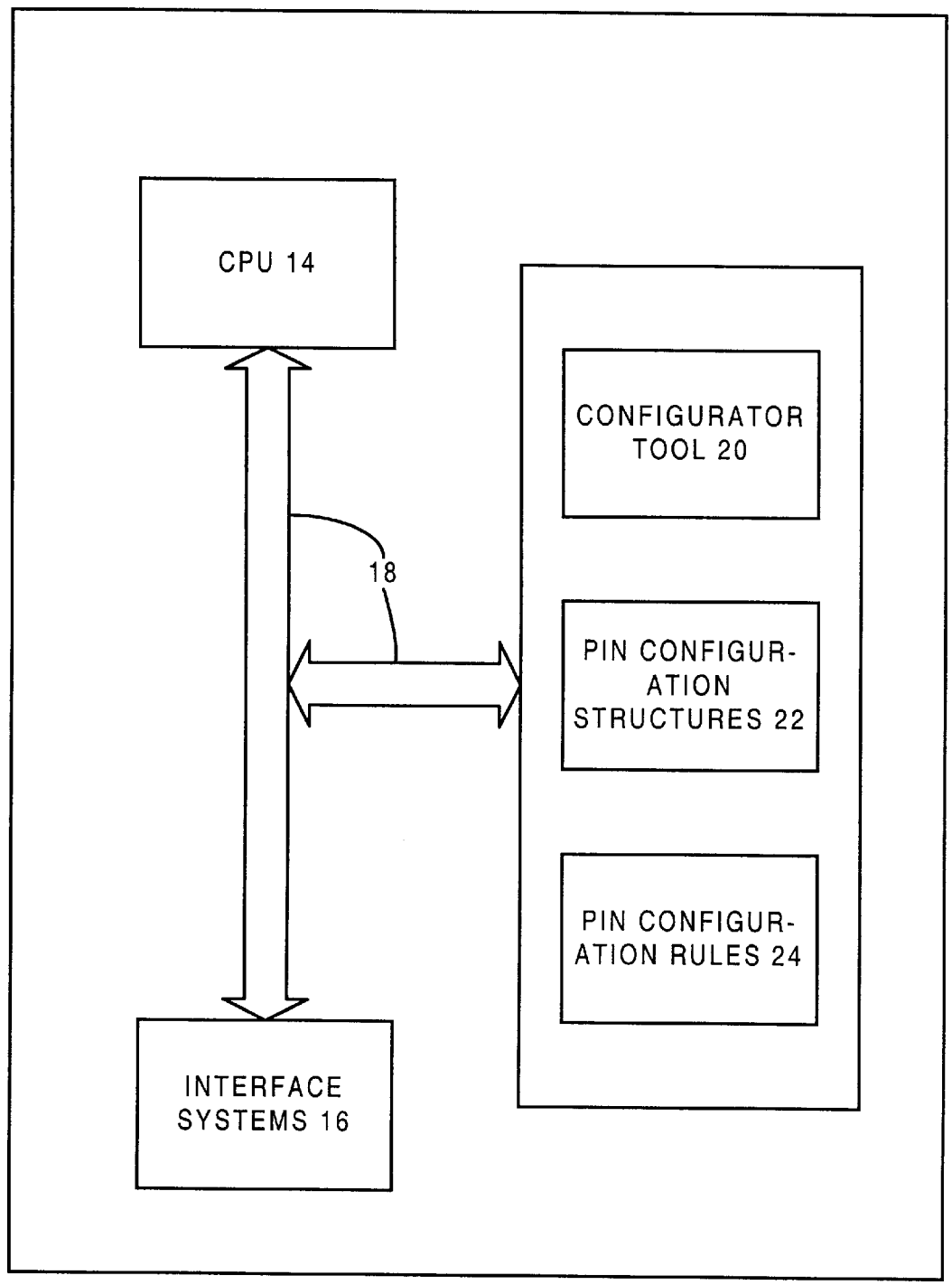
FIG. 1 is a block diagram of the computer system of the present invention.

FIG. 1 depicts a computer system incorporating the present invention. Those skilled in the art will appreciate that the mechanisms and apparatus of the present invention apply equally to any computer system, regardless of whether the computer system is a complicated, multiuser computing apparatus or a single user workstation. As shown in FIG. 1, the computer system 10 comprises a main or central processing unit (CPU) 14 connected to a memory 12 and interface systems 16 via an interface bus 18. Although the computer system 10 is shown to contain only a single main CPU and a single system bus, it should be understood that the present invention applies equally to computer systems that have multiple buses that each performs different functions in different ways.

The interface systems 16 may involve complex input/output (I/O) systems that include separate, fully programmed microprocessors or may involve simple I/O adapters to perform similar functions. The interface systems 16 may include terminal interfaces, network interfaces, mass storage interfaces, or any other known interface systems.

The memory 12 includes a high level automatic core configurator (HLCC) tool 20, pin configuration structures (PCS) 22, and pin configuration rules (PCR) 24. The HLCC is an interactive design entry/checking tool that uses an input behavior/gate design as the input. No interconnections are required to be performed by the user manually. The core designer need only define a PCS for all primary input/output pins of the chiplet or core when writing the source. The PCSs contain configuration data the HLCC uses for the second stage. The PCS pin definitions may be defined in the HDL source or in a separate PCR file. Thus, existing cores can be used with the HLCC of the present invention by simply defining a PCR file for the I/O pins.

Figure 2:
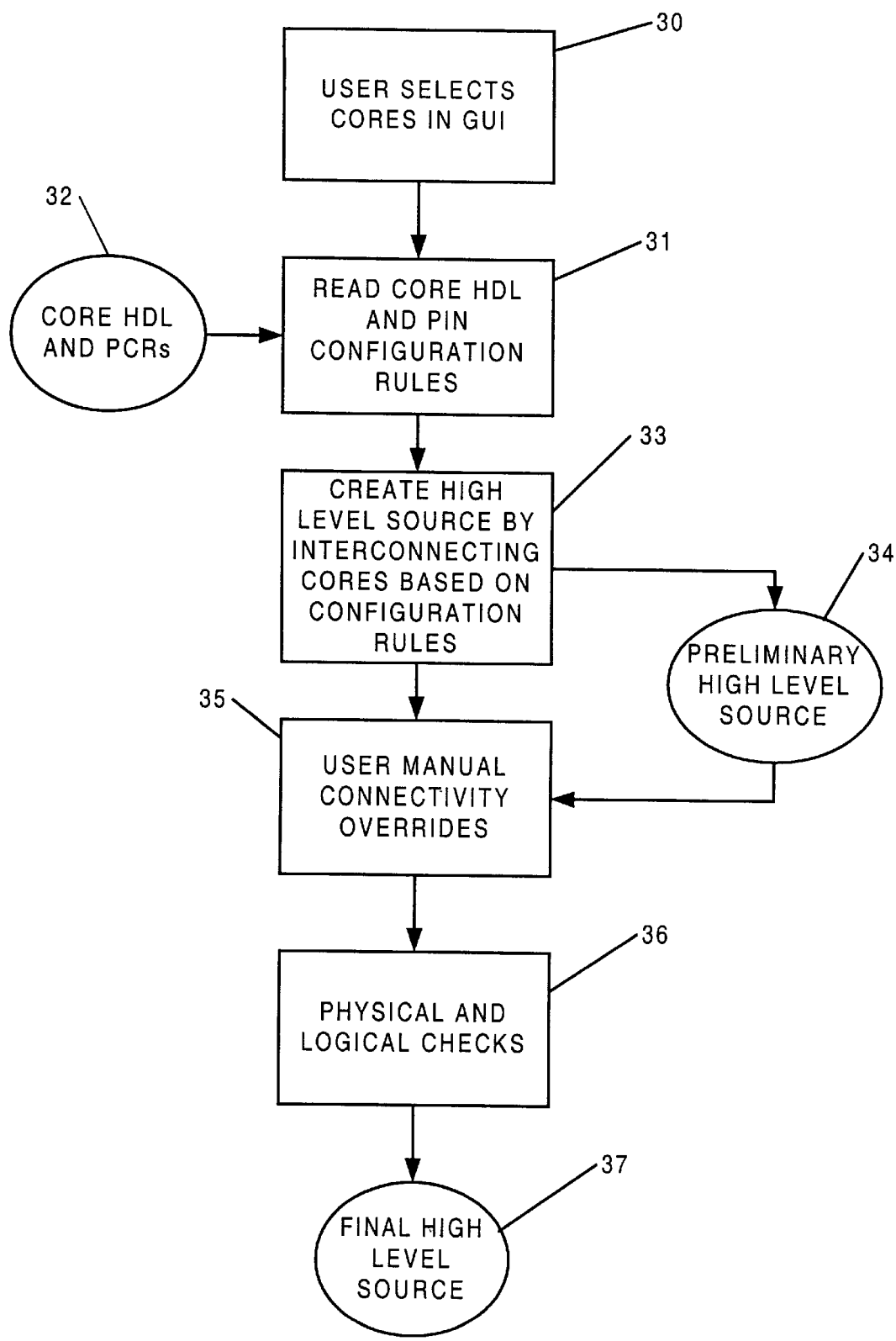
FIG. 2 is a flow diagram showing the basic process steps of the high level automatic core configurator of the present invention.

FIG. 2 depicts a general flow diagram of the HLCC tool 20. As shown in FIG. 2, the first step 30 is for the user to select, from a graphic user interface (GUI), the core chiplets that the user desires to be integrated into the core. In the second step 31, the HLCC tool 20 reads the chiplet high level interface or symbol from the memory 12, along with the PCS and the PCR. The next step 33 is to automatically generate a preliminary high-level source 34 for interconnecting the core chiplets in a legal way according to the PCS information. At this point, a preliminary high level interconnection is available and the high-level user HDL for the core can be written out. If the user desires to manually reconnect some nets in the next step 35, the design connectivity is checked in step 36 against the physical and logical rules in the PCS, and warning messages may be issued. Automatic repowering may also be done by HLCC to correct electrical fanout errors. The result from the process shown in FIG. 2 is the generation of a final high-level source 37 that configures the chiplets or cores into the desired configuration.

Figure 3:
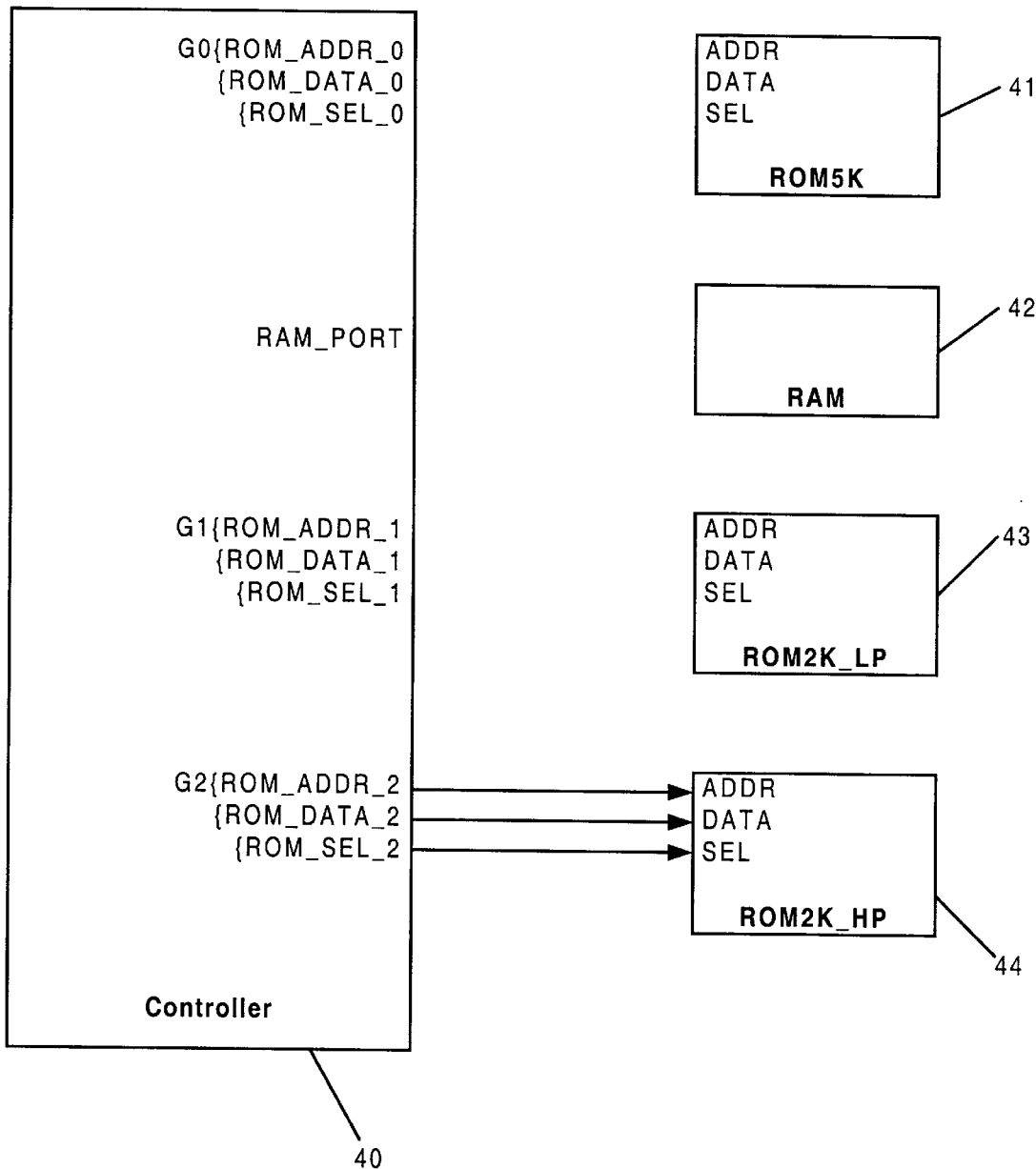
FIG. 3 is a schematic illustration of a controller chiplet being connected to a plurality of memory chiplets using the high-level core configurator of the present invention.

FIG. 3 depicts an example of an automatic interconnection of chiplets using the PCS data according to the present invention. In this example, a controller chiplet 40 is defined that the user wants to connect to a plurality of memory chiplets 41–44, including two 2K ROMs 43 and 44, one 5K ROM 41 and a RAM 42. The PCS entries for two pins in the controller chiplet 40 are shown as ROM_ADDR_2 and ROM_SEL_2.

The HLCC of the present invention initially picks ROM ADDR_2 and finds that it is part of a pin GROUP G2, and that it must be connected to a chiplet of either type ROM2K_LP or ROM2K_HP. The LINK NAME is ROM ADDR, and it is determined to be an output pin. The HLCC therefore looks for an unconnected input pin in another chiplet with the same LINK_NAME of ROM_ADDR. It finds the ROM2K_HP chiplet 44 and makes the connection, creating a global signal name out of the LINK_NAME appended by an instance name. Since the ROM_ADDR_2 pin of the controller chiplet 40 is part of group G2, the HLCC then connects all the group G2 pins of the controller chiplet 40 to the same memory chiplet 44 and, therefore, completes connecting the ROM_SEL_2 pin to the SEL pin, and the ROM_DATA_2 to the DATA pin of the ROM2K_ HP chiplet 44.

Figure 4:
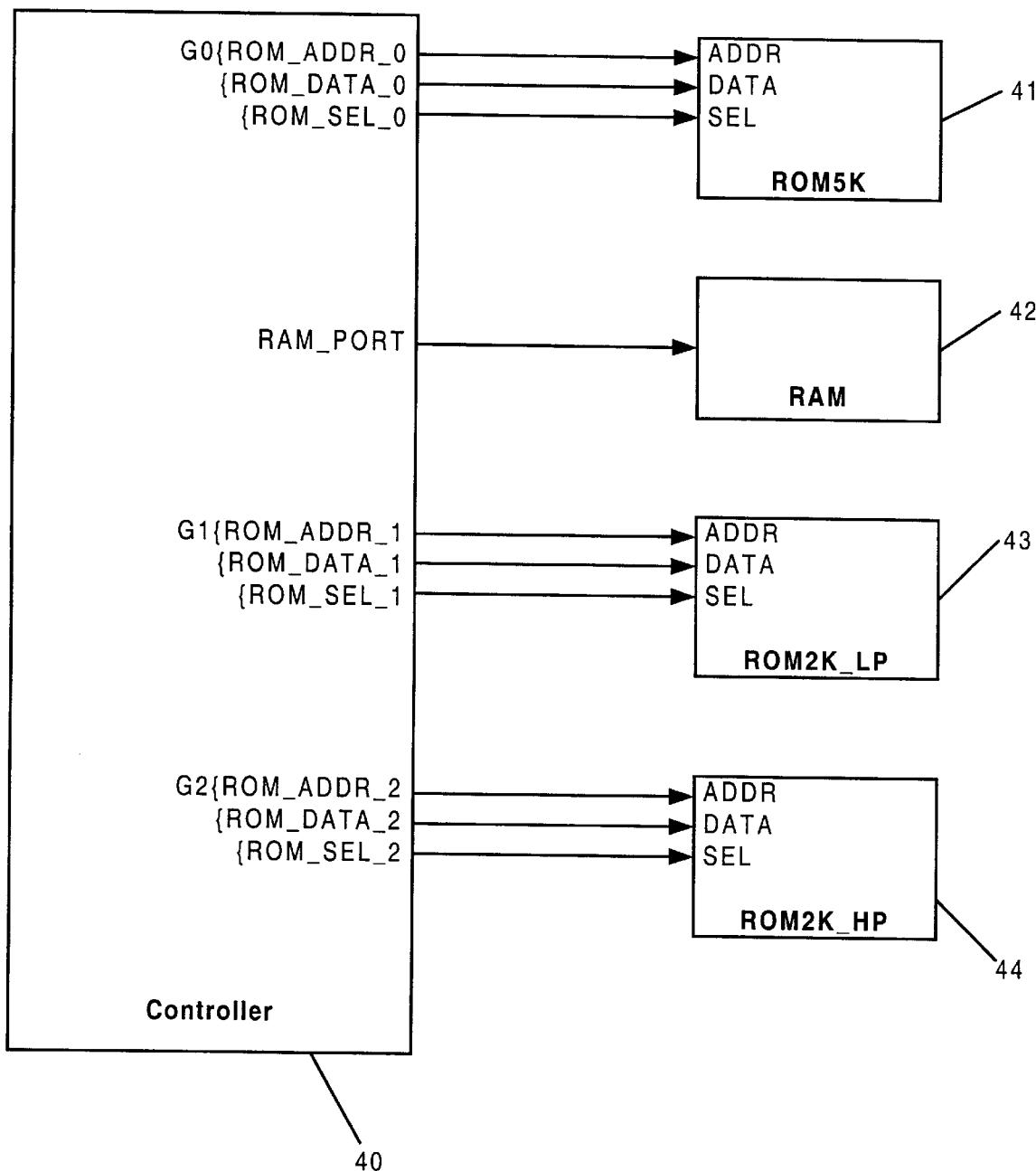
FIG. 4 is a schematic illustration of the controller chiplet shown in FIG. 3 after all of the connections are established between the memory chiplets and the controller chiplet.

Similarly, the G1 and G0 ports and the RAM port of the controller chiplet 40 are interconnected to the other memory chiplets 41–43, as shown in FIG. 4. The G1 and G0 ports are each shown as having a group of pins connected to respective groups of pins on the memory chiplets 41 and 43.

The following Table 1 provides a list of required and optional extension components of the PCS:

TABLE 1

| SAMPLE PIN CONFIGURATION EXTENSIONS | |
| --- | --- |
| Extension Type | Example |
| Required Extensions: | |
| PIN_NAME | ADDR |
| LINK_NAME | ROM_ADDR |
| Optional Extensions: | |
| Group_ID | A, B, 0, 1, etc. |
| Legal_Cores | ROM5k, PCISLAVE, etc. |
| Link_TYPE | INT_I[O,B], EXT_I[O,B] |
| Link_ORDER | LL, LH, L0_L2, etc. |

TABLE 1-continued

SAMPLE PIN CONFIGURATION EXTENSIONS

| Extension Type | Example |
| --- | --- |
| Sourceless_Tie | GND, VDD |
| Link_OPTIONS | [NO]Must_Connect, [NO]Term_IF_Sinkless |
| Repower_CAP | 0.4pf |
| Fanout_Limit | 1, 2, etc. |

The PIN_NAME defines which pin in the chiplet the PCS refers to. The LINK_NAME defines the global net type to which the pin should be connected to. Pins with similar LINK_NAMEs are tied together if other tests allow it. The GROUP_ID defines a method by which pins may be grouped such that they are all treated as a bundle to be tied to the same chiplet, such as in the example shown in FIGS. 3 and 4. The LEGAL_CORES field allows restriction of which core types may be attached to the pin. The FANOUT_LIMIT allows single pin-to-pin connections, or multisink connections, such as a shared global link data bus. Other extensions can be defined to allow further logical consistency checks and physical limitation checks.

Figure 5:
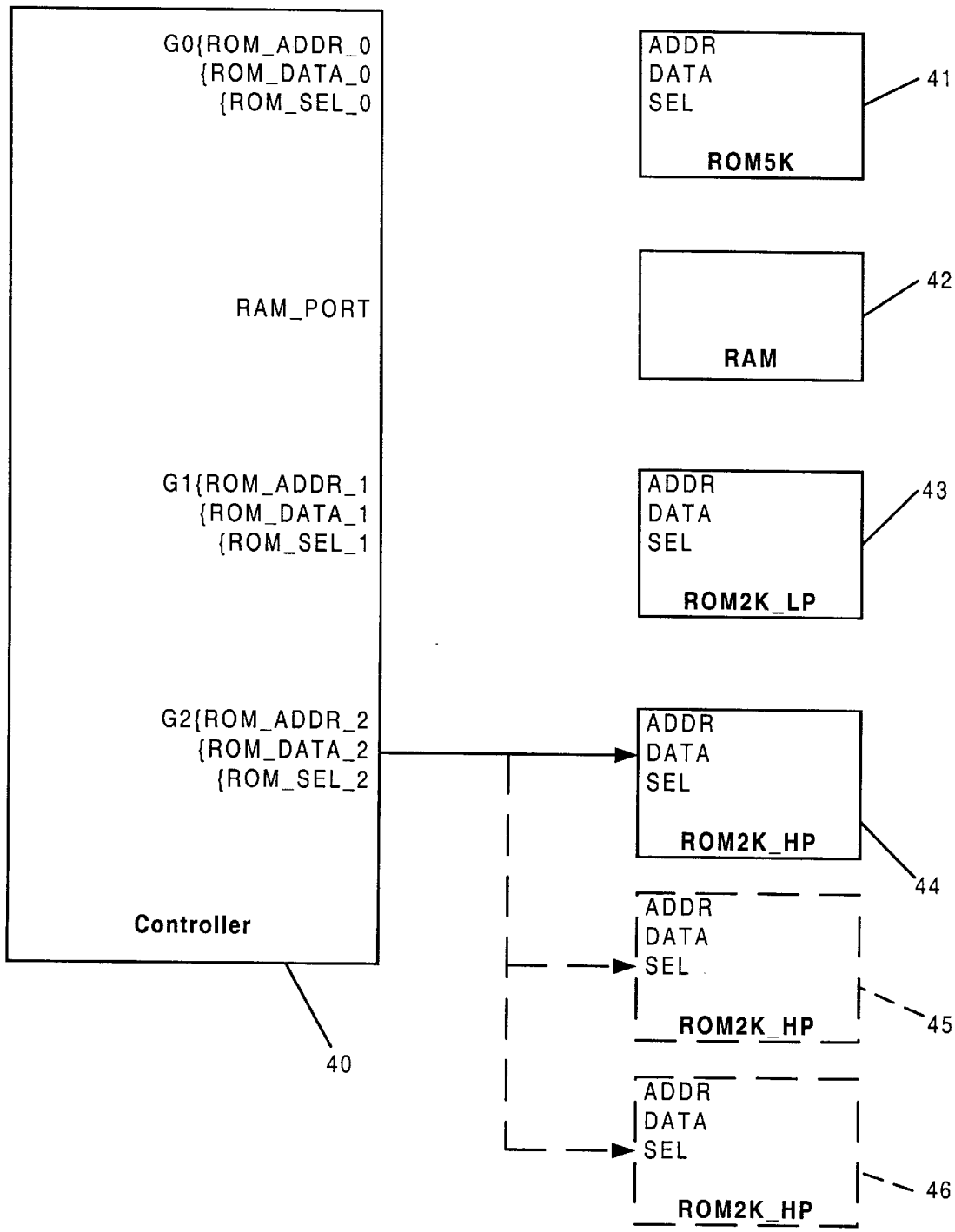
FIG. 5 is a schematic illustration of the controller chiplet shown in FIG. 4 having a multiple fanout connection between one of the pins on the controller chiplet and a plurality of ROM chiplets.

FIG. 5 shows the controller chiplet 40 of FIGS. 3 and 4 having a multiple fanout connection between one of the groups of pins on the controller chiplet and a plurality of ROM2K_HP memory chiplets 44, 45, 46. The FANOUT_LIMIT of the G2 pin group must be three or greater to permit the multiple fanout connection to the three ROM2K_HP memory chiplets 44–46 shown in FIG. 5. The pin groups typically have defined fanout limits because only a limited number of circuits can be loaded off of each output based on the power of the output pin. For example, a pin on a controller chiplet might have a fanout limit of five, which means that only enough power is available for five or fewer input pins of other chiplets to be connected to that controller pin. If a user tries to connect a sixth input pin to that controller chiplet pin, the HLCC would flag that as an error and try to find another more suitable place to connect that input pin.

Figure 6:
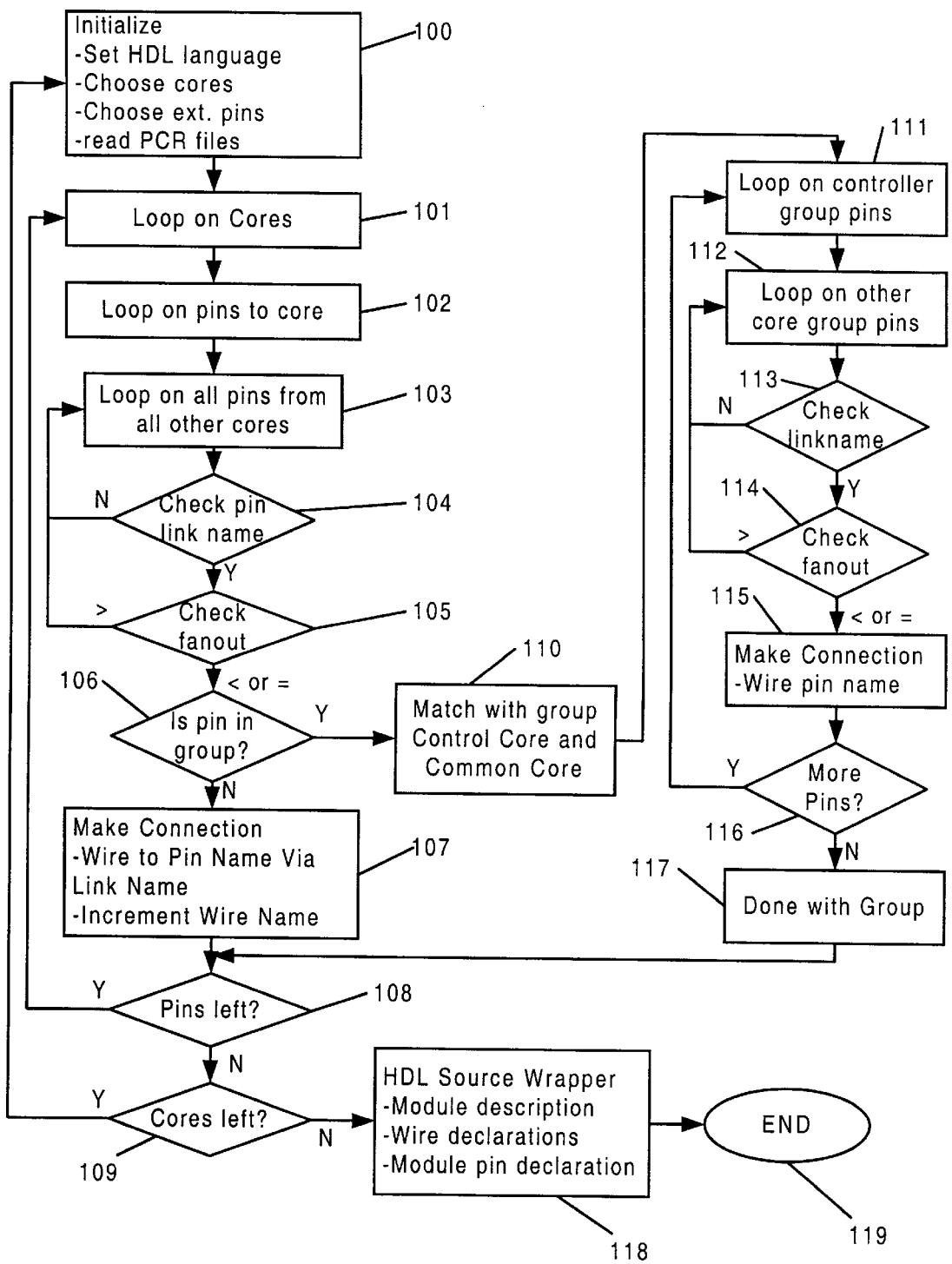
FIG. 6 is a flow diagram that shows the process steps of the algorithm used to carry out the core configuration method of the present invention.

FIG. 6 shows the process steps of the algorithm used to carry out the core configuration method of the present invention. At step 100, the HLCC performs an initialization step to (1) set the HDL language, which can be VERILOG, VHDL or any other recognized format; (2) choose the cores that are to be configured together; (3) choose the external pins that need to be flagged and tied out externally of the block; and (4) read in the PCR files, which are the description files stating what the pins are.

The HLCC then proceeds to step 101, which is the main loop where it loops on all the cores that are to be connected together. One core will be selected as a starting point and the HLCC will then proceed to step 102 where it loops on all of the pins in that core. For each unconnected pin in the core, the HLCC proceeds to step 103 where it loops through all the pins on all the other cores that have not yet been selected and then proceeds to step 104 and checks to see if there is a pin link name that matches. If there is a pin link name that matches, the HLCC then checks the fanout limit of that pin in step 105. If the configuration is within the fanout parameters (i.e., less than or equal to the FANOUT_LIMIT of that pin), then the HLCC proceeds to step 106 and checks whether the pin is in a special group (i.e., whether it has a GROUP_ID). If a fanout limit on an output pin will be exceeded, the user can control whether automatic re-buffering is done or not, or whether HLCC looks for another output pin to connect to. Assuming the pin is not in a special group, the HLCC proceeds to step 107 where a connection is then made and a signal name is created based on the next sequential pin connected of the link name.

The pin connection is made in step 107, for example, by instantiating a wire from the pin name via the link name. The wire name is then incremented so that the HLCC can compensate for multiple wires for the same pin name to different cores and so forth. Then HLCC then proceeds to step 108 where it checks to see if there are more pins left for that core and, if so, goes back to step 102 to loop on the remaining pins from that core. If there are no pins left, the HLCC then proceeds to step 109 where it checks to see if there are more cores left and, if so, goes back to step 101 to loop on the remaining cores in the proposed core configuration.

If the pin is in a special group, then the HLCC proceeds from step 106 to the process steps shown on the right-hand side of FIG. 6 and all of the pins of the group are connected together one-by-one according to their link names. First, the pin is matched with the group control core and the common cores in step 110. The HLCC matches all of the group names together in the core it is connecting that pin group to (control core) and the core it is currently working on (common core). The HLCC then proceeds to step 111 where it loops on the controller group pins, and then to step 112 where it loops on the other core group pins to see if there are other cores that have the same groups. If so, a multiple fanout configuration will be made.

The HLCC then checks the link name in step 113. If the link name is correct, it then checks the fanout limit of that pin in step 114. If the configuration is within the fanout parameters (i.e., less than or equal to the FANOUT_LIMIT of that pin), a connection is then made and the pin name is wired in step 115. The HLCC then proceeds to step 116 where it checks to see if there are more pins to loop in this group.

It should be noted that the multiple fanout condition can be created on either side of the process flow shown in FIG. 6. That is, the fanout configuration can be created between pins within a special pin group or outside of a special pin group. As an example, the HLCC might start looping on a primary core and then proceed to loop on a second core. While looping on the second core, a link name might be found that is actually in a group. When the matching group condition is being performed, all the group pins in that core are found and linked up. However, that permits another core, still within the same group, to have the same link name matched up again and treated as a fanout within that group.

Once the HLCC reaches step 117 where all of the pins in the group have been looped through, the HLCC then returns to step 108 of the process flow shown on the left-hand side of FIG. 6. The HLCC increments for every core it loops through and checks to see if there are any cores left after each loop. In each case where no suitable pin is found for an unconnected pin, the unconnected pin is tied or terminated according to preset LINK_OPTIONS. When there are no cores and no unconnected pins left, the HLCC proceeds to step 118 where an HDL source wrapper is created. The HDL source wrapper includes a module description, the wire declarations, the module pin declarations, the input/outputs, and the module architecture. The HLCC is then at the end step 119, which completes the program flow.

The HLLC according to the present invention provides an innovative method and system for automatically configuring chiplet-based cores or multiple cores with a general Pin Configuration Rule that is easy to code, extensible, and can be applied to existing designs with no modification of the cores themselves.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhausted or to limit the invention to the precise form disclosed. Many modifications and variations are possible in light of the above teachings without departing from the spirit and scope of the following claims.

We claim:

1. A method of creating a system of interconnected cores, comprising the steps of:

creating for each core a pin configuration structure based on a set of pin configuration rules;

selecting a plurality of cores to be interconnected;

accessing the pin configuration structure for the cores selected; and connecting the cores using a connectivity program based on the pin configuration structure and configuration rules for the selected cores.

2. The method of claim 1, further comprising the steps of:

determining a fanout limit for each pin of the cores; and connecting the cores in a multiple fanout configuration using the connectivity program to ensure that an acceptable number of fanout connections is not exceeded.

3. The method of claim 1, further comprising the steps of:

determining for each pin of the cores whether the pin is part of a group of related pins; and using the connectivity program to match each group of related pins together when connecting the cores.

4. The method of claim 1, further comprising the step of:

initializing the connectivity program by choosing a set of cores to be connected together, flagging external pins on the cores, and loading descriptive files containing the pin configuration structure and configuration rules.

5. The method of claim 1, further comprising the step of creating a high-level source that contains information about the system of interconnected cores created.

6. The method according to claim 5, further comprising the step of performing a logical verification based on said source.

7. The method of claim 1, wherein said cores comprise a plurality of chiplets, and said connectivity program connects said chiplets into a single functional core.

8. A computer system comprising:

a central processing unit;

a bus;

computer system memory, said computer system memory being connected to said central processing unit via said bus; and a configurator tool stored in said computer system memory and executable on said central processing unit, said configurator tool being operable to create a system of interconnected cores based on a pin configuration structure and a set of configuration rules for the cores.

9. The computer system according to claim 8, wherein said configurator tool further comprises:

a tool for accessing a pin configuration structure and a set of configuration rules for the cores; and a tool for connecting the cores together based on the pin configuration structure and the configuration rules.

10. The computer system according to claim 8, wherein said configurator tool further comprises:

a tool for determining a fanout limit for each pin of the cores; and a tool connecting the cores in a multiple fanout configuration while ensuring that the fanout limit is not exceeded.

11. The computer system according to claim 8, wherein said configurator tool further comprises:

a tool for determining for each pin of the cores whether the pin is part of a group of related pins; and a tool for matching each group of related pins together when connecting the cores.

12. The computer system according to claim 8, wherein said configurator tool further comprises a tool for creating a high-level source that contains information about the system of interconnected cores created.

13. A computer-readable medium having computer-executable instructions for creating a system of interconnected cores by performing steps comprising:

accessing a pin configuration structure and a set of configuration rules for the cores; and connecting the cores together based on the pin configuration structure and the configuration rules.

14. The computer-readable medium of claim 13, wherein said steps performed by the computer-executable instructions further comprise the steps of:

determining a fanout limit for each pin of the cores; and connecting the cores in a multiple fanout configuration while ensuring that the fanout limit is not exceeded.

15. The computer-readable medium of claim 13, wherein said steps performed by the computer-executable instructions further comprise the steps of:

determining for each pin of the cores whether the pin is part of a group of related pins; and matching each group of related pins together when connecting the cores.

16. The computer-readable medium of claim 13, wherein said steps performed by the computer-executable instructions further comprise the step of creating a high-level source that contains information about the system of interconnected cores created.

17. The computer-readable medium of claim 16, wherein said steps performed by the computer-executable instructions further comprise the step of performing a logical verification based on said high level source.

* * * * *